United States Patent [19]

Pickering et al.

[11] Patent Number: 5,177,419

[45] Date of Patent: Jan. 5, 1993

[54] APPARATUS FOR CONTROLLING A LOAD LIFTING ELEMENT OF A VEHICLE IN RESPONSE TO THE WEARING OF A MOTOR BRUSH

[75] Inventors: William Pickering, University Heights; Bruce A. Nielsen, Painesville; Arthur Wild, Willoughby, all of Ohio

[73] Assignee: Caterpillar Industrial Inc., Peoria, Ill.

[21] Appl. No.: 676,028

[22] Filed: Mar. 27, 1991

[51] Int. Cl.⁵ .............................................. H02P 3/00
[52] U.S. Cl. .................................... 318/541; 340/648; 318/449
[58] Field of Search ............... 318/541, 558, 450, 480, 318/474-476, 478, 491, 449; 310/245, 229, 249, 238, 242, 248, 240, 243, 244, 246, 241; 340/648, 635

[56] References Cited

U.S. PATENT DOCUMENTS

| | | | |
|---|---|---|---|
| 4,024,525 | 5/1977 | Baumgartner et al. | 349/267 R |
| 4,093,091 | 6/1978 | Gregg et al. | 214/673 |
| 4,206,829 | 6/1980 | Melocik | 180/290 |
| 4,316,186 | 2/1982 | Purdy et al. | 310/245 X |
| 4,394,648 | 7/1983 | Mattson | 340/648 X |
| 4,528,556 | 7/1985 | Maddox | 340/648 |
| 4,542,374 | 9/1985 | Kollmannsberger et al. | 340/648 |
| 4,761,594 | 8/1988 | Rodi et al. | 318/480 X |

OTHER PUBLICATIONS

U.S. application Ser. No. 07/591,312, filed Oct. 1, 1990, by: Mark L. Elliott et al.

Primary Examiner—A. Jonathan Wysocki

[57] ABSTRACT

An apparatus for controlling a load lifting implement of a work vehicle in response to the condition of a motor brush is provided. The vehicle has a frame and the load lifting implement is connected to the frame and elevationally moveable relative to the frame between first and second directions. A brush wear indicator senses the wear of the motor brush and produces a warning signal in response to a predetermined amount of wear of the motor brush. A control system receives the warning signal and responsively controllably inhibits the elevational movement of the load lifting implement in at least one of the first and second directions.

9 Claims, 3 Drawing Sheets

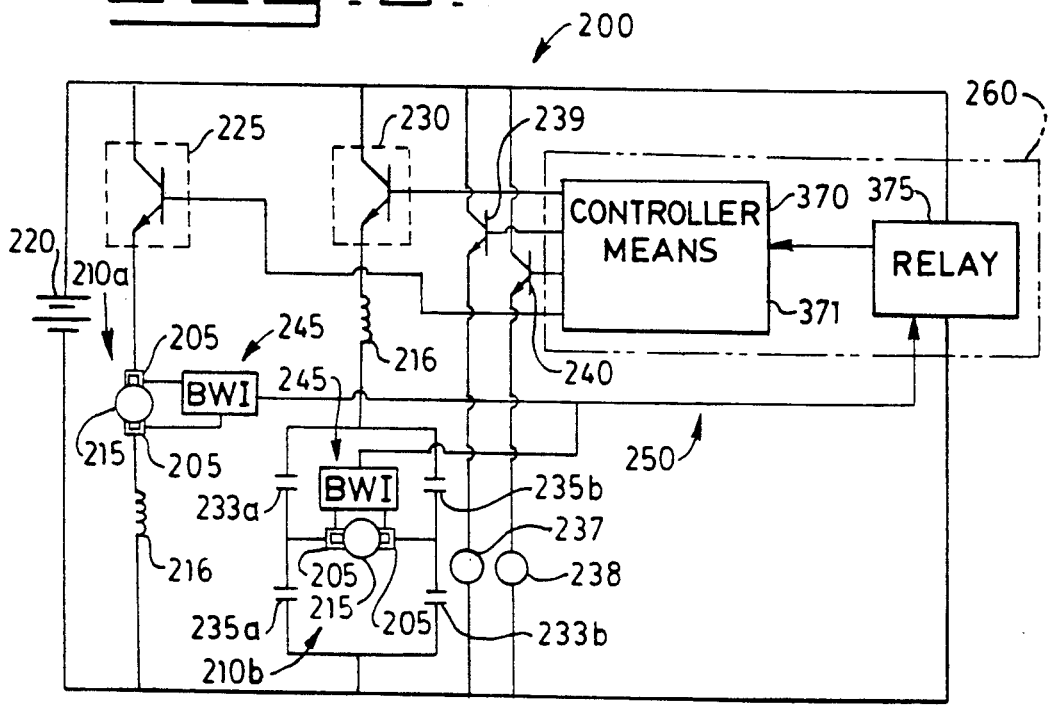
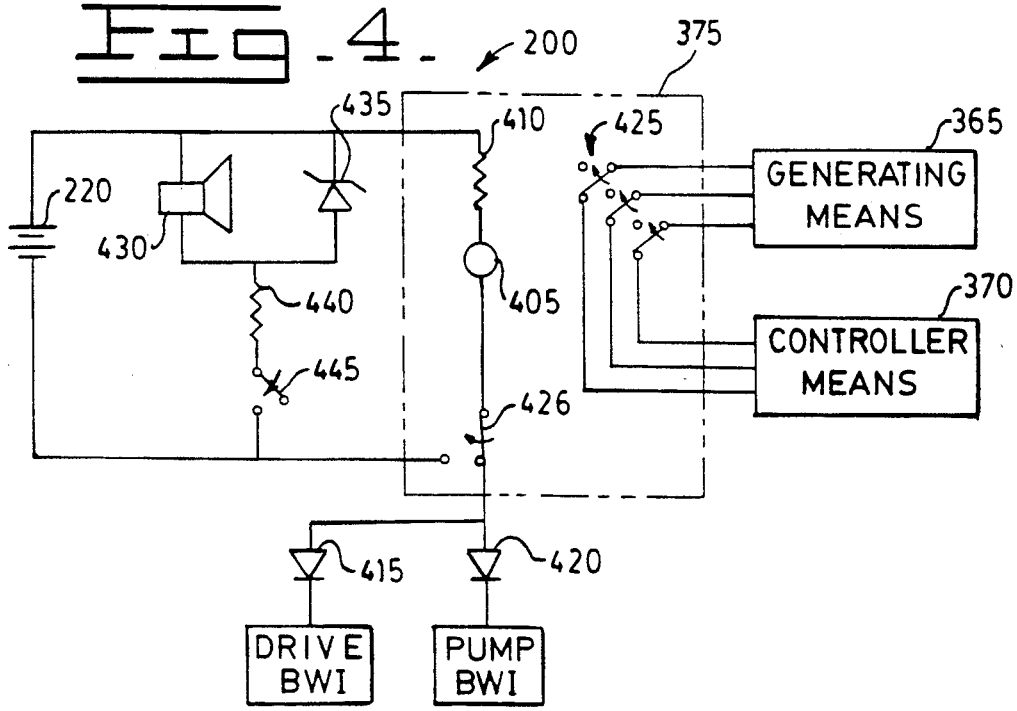

APPARATUS FOR CONTROLLING A LOAD LIFTING ELEMENT OF A VEHICLE IN RESPONSE TO THE WEARING OF A MOTOR BRUSH

DESCRIPTION

1. Technical Field

This invention relates to an apparatus for controlling a work element of a vehicle in response to the condition of a motor brush associated with an electric motor and more particularly to an apparatus for inhibiting the function of the work element in response to the condition of the motor brush.

2. Background Art

Direct current motors or generators have a commutator which is fixed to a rotating armature and is electrically connected to the armature windings. The armature is electrically connected to an external power circuit through brushes which engage the rotating commutator. As the commutator rotates, the contact faces of the brushes gradually wear away. Wearing of the brushes cause them to shorten in length and eventually they must be replaced. If a brush is allowed to wear beyond a certain amount, detrimental scoring of the motor may occur.

In the field of working vehicles, such as lift trucks, conventional circuitry is used to detect brush wearing conditions. Many of these designs employ visual or audible indications that the brushes have worn a preselected amount. However, these types of signals may be neglected by the operator. For example, when a visual or audible warning occurs an operator may continue operating the vehicle for many hours during which time the motor may develop detrimental scoring.

It is desirable to discourage an operator from continuing to use the vehicle when a predetermined amount of wear occurs. For example, if a vehicle function is disabled in response to a brush wearing condition, the vehicle's operability will be limited and the operator will not be able to complete his tasks. Therefore, the operator will be inclined to have the brushes replaced. Additionally, it is desirable to prevent an operator from overriding the system. For example, if during a brush wearing condition an operator is able to manipulate the vehicle controls in a manner that overrides the system, all the vehicle functions may be operable. This problematic situation can lead to detrimental motor scoring because the operator is no longer motivated to have the brushes replaced. Therefore, it is important to prevent an operator from overriding the system.

The present invention is directed to overcoming one or more of the problems as set forth above.

DISCLOSURE OF THE INVENTION

In one aspect of the present invention, an apparatus is provided for controlling a work element of a vehicle in response to the condition of a motor brush associated with an electric motor. A brush wear indicator senses the wear of the motor brush and produces a warning signal in response to a predetermined amount of wear of the motor brush. A control system receives the warning signal and responsively controllably inhibits the function of the work element.

In another aspect of the present invention, an apparatus for controlling a load lifting implement of a work vehicle in response to the condition of a motor brush is provided. The vehicle has a frame and the load lifting implement is connected to the frame and elevationally moveable relative to the frame in first and second directions. A brush wear indicator senses the extent of wear of the motor brush and produces a warning signal in response to a predetermined amount of wear of the motor brush. A control system receives the warning signal and responsively controllably inhibits the elevational movement of the load lifting implement in at least one of the first and second directions.

BRIEF DESCRIPTION OF THE DRAWINGS

For a better understanding of the present invention, reference may be had to the accompanying drawings, in which:

FIG. 2 is an electrical schematic of a control system incorporating the present invention;

FIG. 4 is an electrical schematic of the relay in conjunction with the control system incorporating the present invention.

BEST MODE FOR CARRYING OUT THE INVENTION

Figure 1:
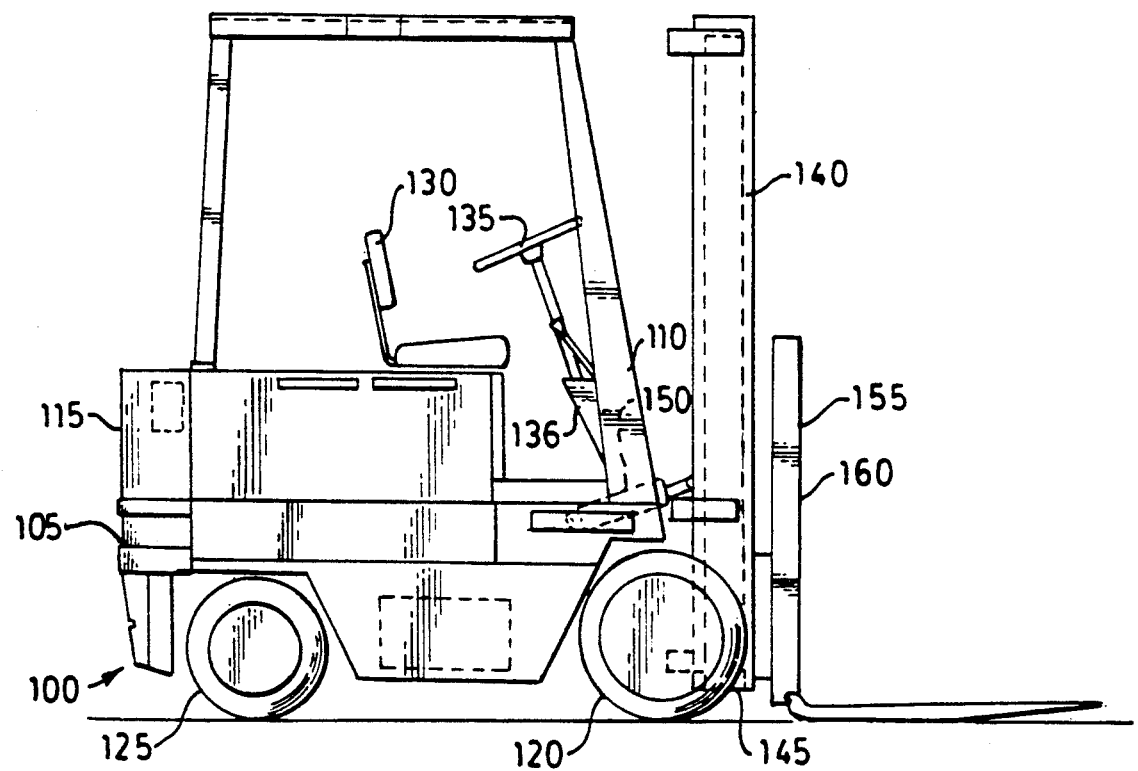
FIG. 1 is a side elevation of a lift truck make according to the present invention.

An exemplary embodiment of a work vehicle 100 or, more particularly a lift truck, made according to the present invention is illustrated in FIG. 1 and includes a vehicle frame 105 having a front 110 and a rear 115. The vehicle frame 105 is provided with front wheels 120 and rear wheels 125. The vehicle 100 includes a seat 130 and a steering wheel 135 along with a control console 136 whereby operations of the vehicle 100 may be suitably controlled.

At one end 110 of the vehicle, an upwardly extending mast 140 is pivotally connected to the frame 105. The mast 140 is pivotally connected at a lower end 145 of the mast 140 in a conventional fashion for rotation about a generally horizontal axis. The mast 140 may be tilted toward or away from the frame 105. To accomplish the tilting movement, two double-acting hydraulic cylinders 150 are interposed between the frame 105 and the mast 140.

A Work element 155 or, more particularly, a load lifting implement 160 is connected to the frame 105 via the mast 140 and elevationally moveable relative to the frame in first and second directions. The first direction is defined as an upwardly elevational movement and the second direction is defined as a downwardly elevational movement. The load lifting implement 160 may support a fork or a platform or any other desired load carrying device.

As shown in FIG. 2 an apparatus 200 is provided for controlling the work element 155 of the vehicle 100 in response to the condition of a motor brush 205 associated with an electric motor 210a, 210b. The electric motor 210a, 210b includes a commutator 215 and a field winding 216. The motor brush 205 is connected to the commutator 215 in a manner that provides translational movement toward the commutator 215 as the brush 205 wears, which is well known. The electric motors illustrated in FIG. 2 are a hydraulic pump motor 210a and a vehicle drive motor 210b. The apparatus 200 also includes a vehicle battery 220 having positive and negative terminals. A first coupling element 225, such as a power transistor, is connected to and between the positive terminal of the battery 220 and the pump motor 210a. The first coupling element 225 is adapted to deliver electrical energy from the battery 220 to the pump motor 210a in a well known manner. A second coupling element 230, similar to the first coupling element 225, is connected to and between the positive terminal of the battery 220 and the drive motor 210b. Additionally, the second coupling element 230 is adapted to deliver electrical energy from the battery 220 to the drive motor 210b. The apparatus 200 includes normally open forward contacts 233a, 233b and normally open reverse contacts 235a, 235b. A forward directional contactor coil 237 controls the state of the forward contacts 233a, 233b and a first on-off switch 239 such as a transistor are in series connection with the battery 220. Additionally, a reverse directional contactor coil 238 controls the state of the reverse contacts 235a, 235b and a second on-off switch 240 such as a transistor are also in series connection with the battery 220.

An indicator means 245 senses the wear of the motor brush 205 and produces a warning signal in response to a predetermined amount of wear of the motor brush 205. In the preferred embodiment the indicator means 245 includes a brush wear indicator (BWI) directly connected to the motor brush 205 for producing a warning signal in response to a predetermined amount of motor brush 205 wear. Under normal conditions (less than the predetermined amount of motor brush wear) the BWI connection to the motor brush 205 has a high impedance value. During exceptional conditions (wearing of the motor brush corresponding to a predetermined amount) the BWI connection to the motor brush 205 is of a low impedance value. Therefore, when no power is being delivered to the motor 210a, 210b the BWI is essentially grounded and responsively the warning signal is produced. Thus, the warning signal is essentially a "grounded" signal. The BWI is well known in the art and the operation of the BWI will not be further discussed.

A control means 250 receives the warning signal from the indicator means 245 and responsively controllably inhibits the function of the work element 155. In the preferred embodiment, the work element 155 includes the load lifting implement 160; however, the work element 155 is not limited to the inclusion of the load lifting implement 160. For example, the work element 155 may include the drive motor or pump motor 210a, 210b.

In the preferred embodiment of the present invention, the control means 250 inhibits the elevational movement of the load lifting implement 160 in at least one of the first or second directions, preferably the first direction.

The control means 250 also includes a logic means 260 which controls the first and second coupling elements 225, 230 as well as the on-off switch 239, dictating motor speed and direction in a well known manner.

Figure 3:
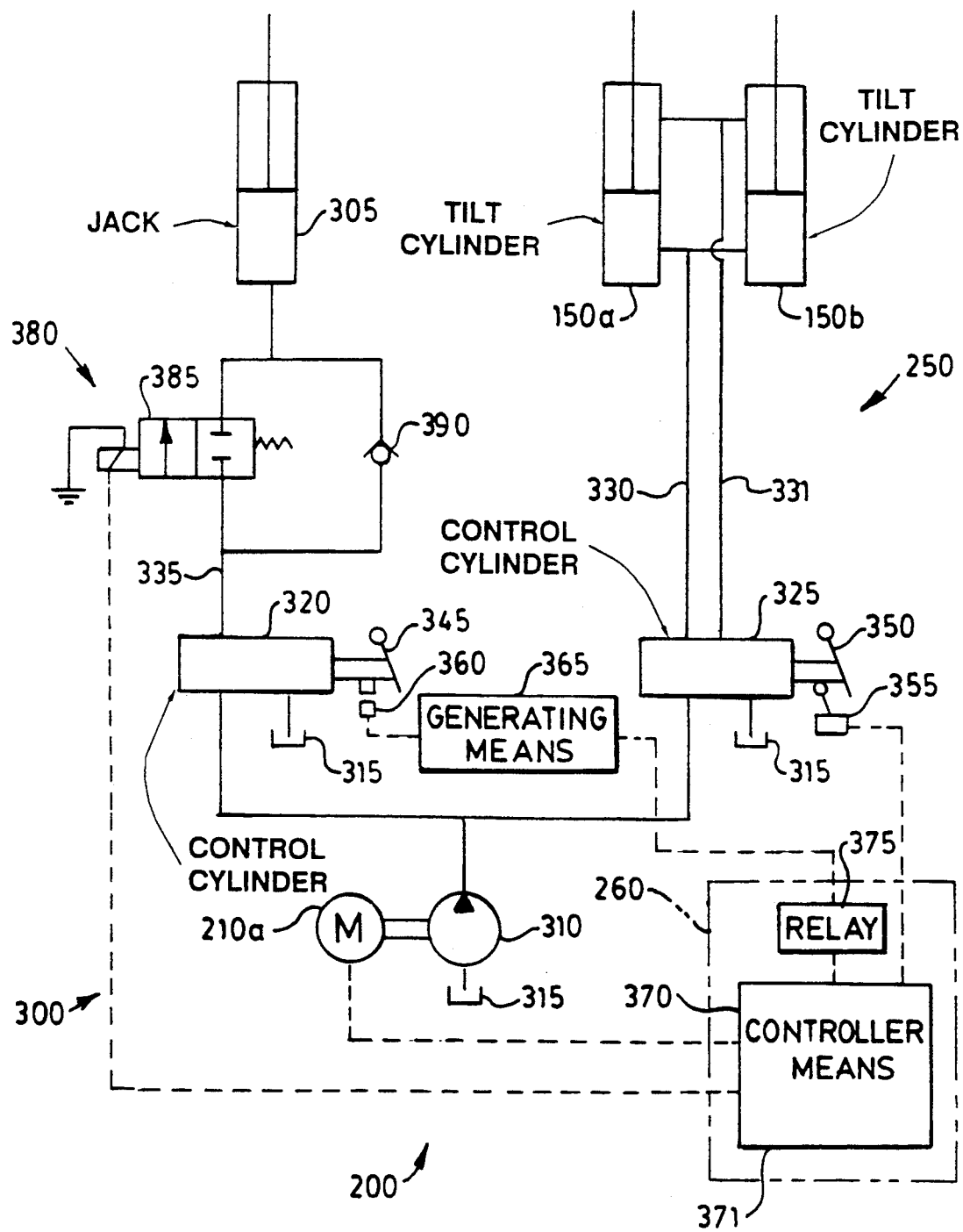
FIG. 3 is an electrical and hydraulic schematic of the control system incorporating the present invention.

Additionally, the control means 250 includes an electro-hydraulic system 300. In the preferred embodiment, the electric motor 210a is connected to the load lifting implement 160 via the electro-hydraulic system 300. As shown in FIG. 3, the electro-hydraulic system 300 includes a single acting fluid operated jack 305 connected to the load lifting implement 160. A pump 310 is connected to and between the single acting fluid operated jack 305 and a reservoir 315. The electric motor 210a is drivingly connected to the pump 310. Additionally, the tilt cylinders 150a, 150b are connected to the pump 310. Hydraulic fluid under pressure for operating the jack 305 and tilt cylinders 150a, 150b is provided by the pump 310 which is driven by the electrical motor 210a. The above description is a preferred embodiment; however, those skilled in the art well realize that a complete electrical system may be employed to power the load lifting implement 160 and any such system is considered equivalent to the instant embodiment of the present invention.

Control of the fluid operated jack 305 and the tilt cylinders 150 is provided by first and second control valves 320, 325. Preferably, the control valves 320, 325 are manually operated 3-position 6-way valves. The control valves 320, 325 are connected to an output of the pump 310 and the reservoir 315. In a neutral position of either of the control valves 320, 325, the jack 305 and tilt cylinders 150a, 150b will neither be extended or retracted. When the second control valve 325 is moved to a second position, pressurized hydraulic fluid from the pump 310 is directed to a conduit 330, extending the tilt cylinders 150a, 150b and pivoting the mast 140 away from the frame 105. In a third position, the second control valve 325 causes the tilt cylinders 150a, 150b to retract by supplying pressurized fluid through a conduit 331, tilting the mast 140 toward the frame 105.

The first control valve 320, in a second position, directs pressurized fluid to a conduit 335 extending the jack 305 and elevating the load lifting implement 160. In a third position, the first control valve 320 connects the conduit 335 to the reservoir 315, enabling the load lifting implement 160 to descend under the force of gravity.

Control of the first and second control valves 320, 325 is provided by an elevating selector 345 and a tilt selector 350, respectively. The tilt selector 350 is coupled to a microswitch 355 to provide a tilting command signal in response to the position of the second control valve 325. The elevating selector 345 is coupled to a hall effect sensor 360 to produce elevating signals in response to the position of the elevating selector 345. A generating means 365 is electrically connected to the hall effect sensor 360. The generating means 365 receives the elevating signals and produces incremental coded digital elevational command signals in response to the position of the elevating selector 345. The elevational command signals are 3-bit digitally coded signals. The 3-bit command signals correspond to numbers ranging from 000 to 111, for example. Each digital number corresponds to a desired speed and direction of the load lifting implement 160.

The logic means 260 includes a controller means 370 for receiving the elevational command signals and responsively producing a powering signal. The electric motor 210a is adapted to receive the powering signal, and the electric motor 210a is energized in response to receiving the powering signal. Preferably the controller means 370 includes a microprocessor 371 such as an SGS Thompson 3870 Model Number MK38P70 produced by Thompson Inc. Under software control, the microprocessor 371 responds to the elevational command signals by producing the powering signal with a duty cycle corresponding to the desired speed and direction, in a well known manner. Additionally, the controller means 370 receives the tilting command signals. Under software control the microprocessor 371 produces the powering signal with a predetermined duty cycle corresponding to the tilting signals, in a well known manner. The pump 310 provides pressurized fluid in response to the electric motor 210a being energized.

Advantageously, the logic means 260 includes a relay 375 connected to and between the generating means 365 and the controller means 370. The relay 375 is adapted to receive the elevational command signals and the warning signal from the BWI, and block the delivery of the elevational command signals to the controller means 370 in response to receiving the warning signal.

Referring to FIG. 4 the structural relationship of the relay 375 to the other circuit elements is shown. The relay 375 is shown in phantom lines. The relay includes a relay coil 405 and a series connected limiting resistor 410 connected to and between the positive battery terminal and the relay 375. Additionally, the pump motor BWI and the drive motor BWI is connected to the relay coil 405 via a first diode 415 and second diode 420 respectively. The first and second diodes 415, 420 are provided to prevent current from flowing between the pump BWI and the drive BWI. Additionally the relay 375 includes three normally closed contacts 425 connecting the 3-bit data line from the generating means 365 to the controller means 370 and a normally closed switch 426 connecting the relay coil 405 to the drive and pump BWI. The operation of the relay 375 is described next.

Under normal conditions (less than the predetermined amount of wearing of the motor brush 205) the relay coil 405 is deenergized and the contacts 425 are closed allowing the elevational command signals produced by the generating means 365 to be delivered to the controller means 370. Consequently, the controller means 370 produces the powering signal to the pump motor 210a.

Under exceptional conditions (a predetermined amount of wearing of the motor brush 205) the BWI produces a warning signal. For example, assume a drive motor brush 205 wears to a predetermined amount. Then the drive motor BWI produces a warning signal. When the relay 375 receives the warning signal, the relay coil 405 becomes energized because a circuit path exists to ground via the drive motor BWI. Responsively, the normally closed switch 426 connects the relay coil 405 to ground and the relay contacts 425 open and the delivery of the elevational command signals to the controller means 370 is blocked. More specifically, the relay contacts 425 open and the 3-bit command signal is blocked. In response to the 3-bit command signal being blocked a digital signal corresponding to the digital number 000, for example, is delivered to the controller means 370. In response to receiving the digital number 000, the controller means 370 produces a control signal and a stopping signal. The pump motor 210a receives the control signal, and deenergizes in response to receiving the control signal. Therefore, the load lifting implement is inhibited from moving in the first direction.

The apparatus 200 also includes an audible warning device such as a warning horn 430. The warning horn 430 is connected in parallel to a Zener diode 435 as a unit and the unit is connected in parallel, through a series connected resistor 440, with the battery 220. The Zener diode 435 is provided for delivering a controllable amount of energy to the horn 430 in a well known manner. Additionally, the relay 375 includes a normally open switch 445 connected in series with the series connected resistor 440 and to the negative battery terminal. The relay coil 405 controls the operation of the normally open switch 445. For example, when the relay coil 405 is energized the switch 445 responsively moves from an open position to a closed position. When the switch 445 is in the closed position, the horn 430 energizes producing an audible warning signal. Additionally, the apparatus 200 may include a visual warning signal (not shown) in conjunction with the audible warning signal.

Adverting back to FIG. 3, a control valve means 380 is provided. Advantageously, the control means 250 includes the control valve means 380 for receiving the stopping signal. The control valve means 380 blocks fluid flow from the pump 310 to the single acting fluid operated jack 305 in response to the received stopping signal. In the preferred embodiment, the control valve means 380 includes an electrically actuatable control valve 385 adapted to receive the stopping signal. The electric control valve 385 is connected to and between the pump 310 and the jack 305, and is shiftable from a first position at which fluid flows from the pump 310 to the jack 305, to a second position at which fluid flow from the pump 310 to the jack 305 is blocked in response to receiving the stopping signal. More specifically, the stopping signal is the absence of electrical energy and the control valve 385 is spring biased to the second position in response to the stopping signal. Additionally, a check valve 390 connected in parallel with the electric control valve 385 is provided. The check valve 390 allows fluid to flow from the jack 305 to the reservoir 315 when the first control cylinder 320 is at the third position and the electric control valve 385 is at the second position.

In another embodiment of the present invention, and referring to FIG. 2, the controller means 370 utilizes software control to limit the speed of either the pump motor 210a or the drive motor 210b. For example, the controller means 370 may be directly connected to the pump BWI and the drive BWI (not shown). Additionally, the controller means 370 is adapted to receive the warning signal from both the pump BWI and the drive BWI. When the controller means 370 receives the warning signal, and under preprogrammed instructions, the controller means 370 limits the speed of either the pump motor 210a or the drive motor 210b to a preselected speed. More specifically, the microprocessor 371 receives the warning signal and responsively energizes either the first coupling means 225 or the second coupling means 230 at a preselected duty cycle. Responsively, either the pump motor 210a or the drive motor 210b is energized driving the motor 210a, 210b at a preselected speed corresponding to the preselected duty cycle. Therefore, the function of the load lifting element 160 may be limited, as well as, other work elements 155 associated with the vehicle 100.

Advantageously, the controller means 370 includes a non-volatile memory device (not shown) for "remembering" if the warning signal had been produced prior to an operator "powering down" the vehicle 100 and consequently the electrical system. Therefore, the operator is prevented from overriding the system and the operator must have the motor brushes 205 replaced when the warning signal is produced.

Once the motor brushes 205 are replaced, the warning signal will no longer be produced and the vehicle 100 reverts to normal operation.

INDUSTRIAL APPLICABILITY

In the overall operation of the vehicle and the vehicle control system, assume, for example that an operator is operating the vehicle and the elevating selector 345 is in a position providing for an elevational command signal corresponding to a digital number 010, for example. Consequently, the controller means 370 delivers a powering signal to the first coupling means 225, energizing the pump motor 210a and providing for pressurized hydraulic fluid to flow. As a result, the load lifting implement 160 moves in the first direction at half speed.

Then, for example, the motor brush 205 connected to the pump motor 210a, wears a predetermined amount. Responsively, the pump BWI produces a warning signal. The relay 375 receives the warning signal, the relay coil 405 energizes, and responsively the contacts 425 open, blocking the delivery of the elevational command signal to the controller means 370. Accordingly, the controller means 370 produces a control signal and a stopping signal. Additionally, the switch 445 closes in response to the energized relay coil 405 and responsively the horn 430 sounds. This gives the operator an audible warning that the motor brushes 205 are worn and need to be replaced.

Moreover, the pump motor 210a receives the control signal and responsively deenergizes. Consequently, no pressurized fluid is available to provide elevational movement in the first direction of the load lifting implement 160. Therefore, the operator is unable to perform all his tasks and he is discouraged from continuing the use of the vehicle.

The operator, however, has full control of the tilt cylinders 150a, 150b and is able to position the mast 140 in any desired rotation. Additionally, the operator is able to control the load lifting implement 160 in the second direction. Therefore, the operator can maneuver the load lifting implement 160 in a manner that allows for a load to be deposited, before traveling to a maintenance area for replacing the motor brushes 205.

Advantageously, the instant embodiment of the present invention prevents the operator from overriding the system. For example, the operator is not permitted to manipulate the elevating and tilting selectors 345, 350 in a manner that provides complete movement of the load lifting implement 160 in the first and second directions. More particularly, in response to receiving the stopping signal, the electric control valve 385 is spring biased to the second position. Fluid is then blocked from traveling from the pump to the jack 305. Therefore, the electric control valve 385 prevents the operator from fully operating the load lifting implement 160, during a predetermined brush wearing condition, regardless of the position of either the elevating or tilting selector valves 345, 350.

As is described above, the instant invention requires the operator to have the motor brushes 205 replaced when the brushes 205 are worn to a predetermined amount. Therefore, detrimental motor scoring will not occur and ultimately the electric motors 210a, 210b motors will have longer life.

Other aspects, objects and advantages of the present invention can be obtained from a study of the drawings, the disclosure and the appended claims.

We claim:

1. An apparatus for controlling a load lifting implement of a work vehicle in response to the condition of a motor brush, said vehicle having a frame and said load lifting implement being connected to the frame and elevationally moveable relative to the frame in first and second directions, comprising:
   a vehicle drive motor being adapted to propel said vehicle;
   a single acting fluid operated jack being connected to said load lifting implement and extensibly moveable in response to receiving pressurized fluid flow to elevationally move said load lifting element;
   a pump being connected to said single acting fluid operated jack and adapted to deliver pressurized fluid to said jack in response to rotation thereof;
   a pump motor being adapted to rotate said pump in response to being energized;
   indicator means for sensing the wear of said motor brush and producing a warning signal in response to a predetermined amount of wear of said motor brush;
   a logic means for receiving said warning signal and responsively producing a control signal, said pump motor being adapted to receive said control signal and substantially deenergize in response to receiving said control signal causing said load lifting implement to be moveable only in said second direction; and
   wherein said vehicle drive motor is operational.

2. An apparatus, as set forth in claim 1, including an elevating selector being so constructed to be moveable to a plurality of positions.

3. An apparatus, as set forth in claim 2, including a generating means for producing predetermined incremental coded digital elevational command signals in response to the position of said elevating selector.

4. An apparatus, as set forth in claim 3, wherein said logic means includes a controller means for receiving said elevational command signals and responsively producing a powering signal.

5. An apparatus, as set forth in claim 4, wherein said pump motor is adapted to receive said powering signal, and said pump motor is energized in response to receiving said powering signal.

6. An apparatus, as set forth in claim 5, wherein said logic means includes a relay adapted to receive said elevational command signals and said warning signal, and to block the delivery of said elevational command signals to said controller means in response to receiving said warning signal.

7. An apparatus, as set forth in claim 1, wherein said logic means produces a stopping signal in response to receiving said warning signal.

8. An apparatus, as set forth in claim 7, including a control valve means for receiving said stopping signal and blocking fluid flow from said pump to said single acting fluid operated jack in response to said received stopping signal.

9. An apparatus, as set forth in claim 8, wherein said control valve means includes an electrically actuatable control valve being adapted to receive said stopping signal, said control valve being connected to and between said pump and said jack, and being shiftable from a first position at which fluid flows from said pump to said jack, to a second position at which fluid flow from said pump to said jack is blocked in response to receiving said stopping signal.

* * * * *